United States Patent
Sakurabayashi

(10) Patent No.: US 7,768,768 B2
(45) Date of Patent: Aug. 3, 2010

(54) SEMICONDUCTOR DEVICE INCLUDING POWER SWITCH AND POWER REINFORCEMENT CELL

(75) Inventor: Taro Sakurabayashi, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 101 days.

(21) Appl. No.: 12/078,764

(22) Filed: Apr. 4, 2008

(65) Prior Publication Data
US 2008/0246108 A1   Oct. 9, 2008

(30) Foreign Application Priority Data
Apr. 5, 2007   (JP)   ............................. 2007-099338

(51) Int. Cl.
*H01L 23/58* (2006.01)
(52) U.S. Cl. .................................................. 361/306.1
(58) Field of Classification Search ......... 361/302–305, 361/328–330, 306.1, 306.2, 306.3, 508, 512
See application file for complete search history.

(56) References Cited

U.S. PATENT DOCUMENTS 6,483,374 B1 *  11/2002  Mizuno et al. ............... 327/534

FOREIGN PATENT DOCUMENTS

| JP | 2004-342924 | 12/2004 |
| JP | 2005-268695 | 9/2005 |

* cited by examiner

*Primary Examiner*—Thomas L Dickey
(74) *Attorney, Agent, or Firm*—McGinn IP Law Group, PLLC

(57) ABSTRACT

A semiconductor device according to one embodiment includes a cell disposition region in which plural basic cells are disposed and a basic power supply wiring. In the cell disposition region are disposed a primitive cell connected to the basic power supply wiring and a high current consumption cell connected to the basic power supply wiring. Furthermore, in the cell disposition region are disposed regularly plural ordinary power switch cells that supply a first current to the primitive cell respectively. The power reinforcement cell including a power switch cell configured so as to flow a predetermined current to the high current consumption cell is disposed near the high current consumption cell.

6 Claims, 11 Drawing Sheets

SEMICONDUCTOR DEVICE INCLUDING POWER SWITCH AND POWER REINFORCEMENT CELL

FIELD OF THE INVENTION

The present invention relates to a semiconductor device that includes a power switch and a power reinforcement cell.

BACKGROUND OF THE INVENTION

The fine fabrication technology of semiconductor devices, which has made a significant progress, is now confronted with a problem of an increasing off-leak current. An off-leak current means a current that flows into the subject semiconductor device while the device is idle. In the total power consumption of a semiconductor device, this unnecessarily flowing off-leak current has increased now up to a level that cannot be ignored. And in order to suppress the increase in this power consumption, there have been proposed various techniques so far.

For example, JP-A-2005-268695 discloses a technique related to a semiconductor integrated circuit having a function to cut off the power supply to each circuit cell. The semiconductor integrated circuit disclosed in this document includes plural circuit cells and plural power switch cells used to cut off the power supply to the circuit cells. The semiconductor integrated circuit further includes a plurality of power supply line groups disposed like vertical stripes at intervals narrower than a predetermined maximum interval and a plurality of branch line groups branched from those power supply line groups respectively and disposed like horizontal stripes within a range from the source power line groups to their adjacent power supply line groups respectively. In this semiconductor integrated circuit, each circuit cell is disposed along a branch line group and supplied a power from the branch line group. The power supply cell is disposed at a branch point between the power supply line group and its corresponding branch line group and used to cut off the power supply from the power supply line group to the branch line group. This document also describes a configuration of a semiconductor integrated circuit provided with a power switch cell having a driving power corresponding to the current consumption in accordance with the number of circuit cells. Furthermore, JP-A-2004-342924 discloses a method for disposing a capacity cell adjacent to a high driving cell so as to assist the power supply to the high driving cell.

Under such circumstances, the inventor of the present invention has considered that in a semiconductor integrated device as described above, the current consumption might differ among plural circuit cells. Consequently, when designing a semiconductor integrated circuit having a plurality of circuit cells among which the current consumption varies, therefore, the widths of the power line groups and the branch line groups, as well as the driving performance of the power switch cell are required to be determined in accordance with those of a circuit cell of which current consumption is more than any of others.

The more circuit pattern areas are reduced in size due to the progress of the fine fabrication technology of semiconductor devices, the smaller the wiring regions (wiring resources) also become. At this time, if a wiring width is determined for power line groups and branch line groups on the basis of the current consumption of a circuit cell that consumes a current more than any of others, the rate of the power supply wiring occupied by wiring resources to meet the reduction increases, thereby the wiring resources to be allocated to signal lines comes to decrease accordingly. Consequently, it becomes difficult to dispose those signal lines properly and this makes it further difficult to design the subject semiconductor device itself in some cases.

In case of securing a wiring resource to realize proper wiring of signal lines while keeping the power supply capacity, the wiring resource requiring area increases. Therefore, even when the subject circuit pattern is further reduced in size, the wiring resource requiring area makes it difficult to reduce the chip area in some cases. This is a new problem that has arisen due to the progress of the fine fabrication technology of semiconductor devices.

SUMMARY OF THE INVENTION

The present invention seeks to improve upon those problems at least in part.

In an embodiment of the present invention, a semiconductor device is disclosed. The semiconductor device includes plural basic power supply wirings laid in a first direction; plural local power supply wirings laid in a direction that crosses the first direction; plural ordinary power switches disposed at nodes between the plurality of basic power supply wirings and the plurality of local power supply wirings respectively and used to connect the basic power supply wirings to their corresponding local power supply wirings respectively; plural circuit cells connected to the local power supply wirings respectively; and a power reinforcement cell including a power switch cell, which is disposed so as to correspond to specific one of the plurality of circuit cells and supply a power to the local power supply wiring connected to the specific circuit cell. In this embodiment, the specific circuit cell should preferably be a circuit that consumes a current more than any of the plurality of circuit cells.

In the semiconductor device in this embodiment of the present invention, the plurality of basic cells are disposed in a cell disposition region. In the cell disposition region are also laid the local power supply wirings. Furthermore, the semiconductor device in this embodiment of the present invention includes plural primitive cells connected to the local power supply wirings, plural high current consumption cells disposed in the cell disposition region and connected to the local power supply wirings respectively, plural ordinary power switches disposed regularly in the cell disposition region and used to supply a first current to the primitive cells, a power reinforcement cell including a power switch cell disposed near the high current consumption cell so as to flow a predetermined current into the high current consumption cells.

If a high current consumption cell consumes a current more than a primitive cell, the current consumption is supplied to the high current consumption cell through the power reinforcement cell including a power switch cell. And the route to supply a current to the primitive cell is formed without depending on the current consumption of the high current consumption cell. Such way, most of the power supply wirings to be formed are adjusted to a low current consumption cell.

According to the embodiment described above, it is possible to provide a semiconductor device that includes power supply wirings laid so as to operate the circuit cells properly and suppress the increase of the chip area to meet the requirement of the fine fabrication technology of semiconductor devices.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION OF THE PREFERRED EMBODIMENTS

The present invention will now be described herein with reference to illustrative embodiments. Those skilled in the art will recognize that many alternative embodiments can be accomplished using the teachings of the present invention and that the invention is not limited to the embodiments illustrated for explanatory purposes.

Figure 1A:
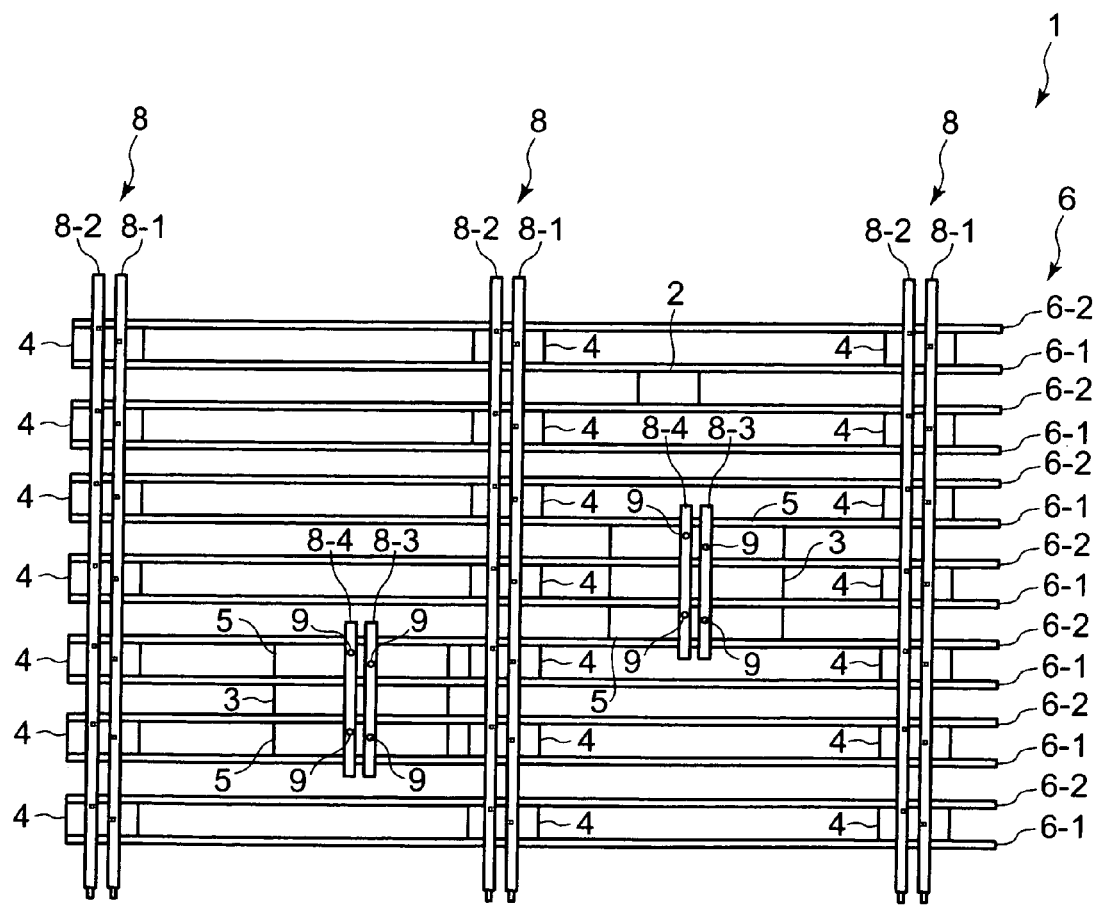
FIG. 1A is a top view of a semiconductor device 1 with respect to its configuration in an embodiment of the present invention.

Hereunder, there will be described an embodiment of the present invention with reference to the accompanying drawings. FIG. 1A is a top view of a semiconductor device 1 with respect to its configuration in the embodiment of the present invention. In this embodiment, the semiconductor device 1 includes a region in which the power supply can be cut off (hereinafter, to be referred to as the power supply control region) and a region in which the power supply is kept continuously (hereinafter, to be referred to as the ordinary region). In each of the power supply control region and the ordinary region of the semiconductor device 1 are formed a logic circuit with use of plural basic circuit cells (minimum unit functional cells such as logic gates including an inverter, a NAND gate, etc. respectively) disposed on a substrate 14.

FIG. 1A shows a layout of the power supply control region with respect to its configuration. The power supply control region of the semiconductor device 1 includes plural primitive cells 2 and plural high current consumption cells 3 that are disposed in a mixed manner. In order to facilitate understanding of the present invention, only one primitive cell 2 is disposed in the layout shown in FIG. 1A. In case where plural primitive cells 2 are to be disposed, their positions are determined according to the configuration of the subject logic circuit to be designed.

The power supply control region of the semiconductor device 1 includes a first metal wiring 6 and an upper layer wiring 8. The first metal wiring 6 and the upper layer wiring 8 are laid so as to cross each other. Furthermore, the first metal wiring 6 includes a supply voltage supply wiring 6-1 and a ground voltage supply wiring 6-2 and the supply voltage supply wiring 6-1 and the ground voltage supply wiring 6-2 are laid parallel. Each primitive cell 2 or high current consumption cell 3 is disposed between a supply voltage supply wiring 6-1 and a ground voltage supply wiring 6-2. The power supply terminal of each primitive cell 2 or high current consumption cell 3 is connected to a supply voltage supply wiring 6-1. The ground terminal of the primitive cell 2 or high current consumption cell 3 is connected to a ground voltage supply wiring 6-2.

The upper wiring 8 is a metal wiring formed on the layer of the first metal wiring 6. The semiconductor device 1 is configured to include plural upper layer wirings 8. Those upper layer wirings 8 are laid in a predetermined direction. In the example of the embodiment to be described below, if any one of those upper layer wirings 8 is distinguished from others, a suffix number "-1" will be added to the end of the subject reference number "8" (e.g., "8-1").

As shown in FIG. 1A, the upper layer wiring 8 includes a first upper layer wiring 8-1, a second upper layer wiring 8-2, a third upper layer wiring 8-3, and a fourth upper layer wiring 8-4. The first upper layer wiring 8-1 supplies a supply voltage and is connected to the supply voltage supply wiring 6-1 through an ordinary power switch cell 4. Each of the ordinary power switch cells 4 corresponds to a node between a first upper layer wiring 8-1 and a supply voltage supply wiring 6-1 and those power switches 4 are disposed almost regularly. The second upper layer wiring 8-2 is connected to a ground voltage and to the ground voltage supply wiring 6-2 through an ordinary power switch cell 4. Each of the ordinary power switch cells 4 is disposed so as to correspond to a node between a first upper layer wiring 8-1 and a supply voltage supply wiring 6-1 and to a node between a second upper layer wiring 8-2 and a ground voltage supply wiring 6-2 respectively. In this embodiment, a power switch cell 4 is disposed between each pair of the supply voltage supply wiring 6-1 and the ground voltage supply wiring 6-2 formed alternately just under the first upper layer wiring 8-1 and the second upper layer wiring 8-2.

A first upper layer wiring 8-1 and a third upper layer wiring 8-3 are connected to each other in a semiconductor chip. Similarly, a second upper layer wiring 8-2 and a fourth upper layer wiring 8-4 are connected to each other in the semiconductor chip. The upper layer wirings may be connected with other upper wirings as will be described in detail.

Near a high current consumption cell 3 is disposed a power enforcement cell including a power switch cell 5, which reinforces the power supply to the high current consumption cell 3. Inside the power enforcement cell including a power switch cell 5 is provided a power switch that is interlocked with the ordinary power switch cell 4 to control the power supply on/off. A power switch and an ordinary power switch cell 4 share a supply voltage supply wiring 6-1. Each third upper layer wiring 8-3 is connected to a supply voltage supply wiring 6-1 through the power enforcement cell including a power switch cell 5. Each fourth upper layer wiring 8-4 is connected to a ground voltage supply wiring 6-2 through the power enforcement cell including a power switch cell 5. Here, a pair of the power enforcement cells including a power switch cell 5 respectively is disposed so as to hold the high current consumption cell 3 from above and under through a supply voltage supply wiring 6-1 and a ground voltage supply wiring 6-2.

Figure 1B:
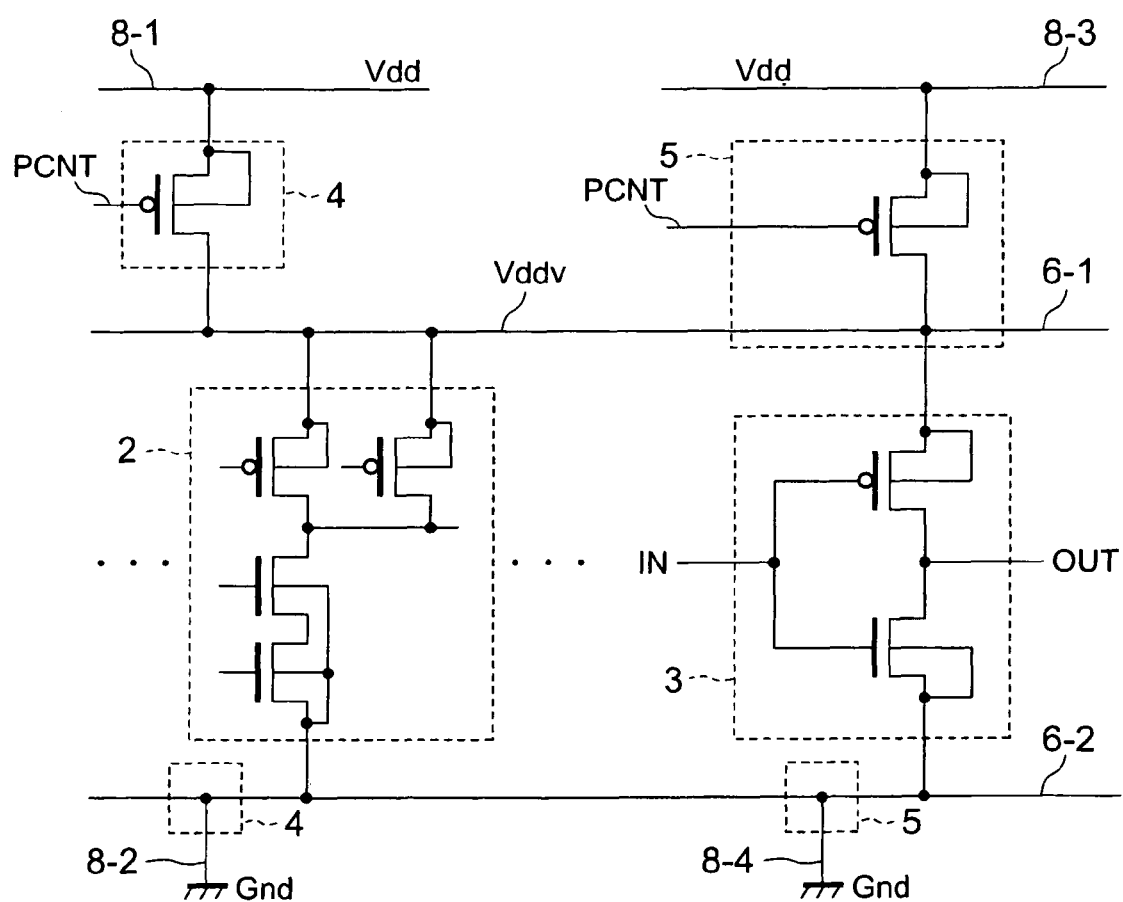
FIG. 1B is a circuit diagram of the semiconductor device 1 in the embodiment of the present invention.

FIG. 1B shows a circuit diagram of the semiconductor device 1 described above. The circuit shown equivalently in FIG. 1B includes the cells (primitive cells 2, high current consumption cells 3, ordinary power switch cells 4, and power enforcement cells including a power switch cell 5 respectively) described above. As described above, the semiconductor device 1 in this embodiment includes a power supply control region.

The ordinary power switch cell 4 and the power enforcement cell including a power switch cell 5 are combined to turn on/off the power supply to the power supply control region.

As shown in FIG. 1B, the ordinary power switch cell 4 of the semiconductor device 1 connects between the first upper layer wiring 8-1 and the supply voltage supply wiring 6-1 and the primitive cell 2 connects between the supply voltage supply wiring 6-1 and the ground voltage supply wiring 6-2. The ordinary power switch cell 4 also connects between the second upper layer wiring 8-2 and the ground voltage supply wiring 6-2.

The power enforcement cell including a power switch cell 5 of the semiconductor device 1 connects between the third upper layer wiring 8-3 and the supply voltage supply wiring 6-1 while the high current consumption cell 3 of the semiconductor device 1 connects the supply voltage supply wiring 6-1 and the ground voltage supply wiring 6-2 respectively. The power enforcement cell including a power switch cell 5 also connects between fourth upper layer wiring 8-4 and the ground voltage supply wiring 6-2. As shown in FIG. 1B, a control signal PCNT is inputted to the gate of a P channel MOS transistor used as a switch and formed in the power enforcement cell including a power switch cell 5. The source terminal of the switch P channel MOS transistor is connected to the third upper layer wiring 8-3 and the drain terminal thereof is connected to the supply voltage supply wiring 6-1. The back gate of the switch P channel MOS transistor is short-circuited to its source terminal.

The high current consumption cell 3 includes a P channel MOS transistor of which back gate is short-circuited to the power supply terminal, as well as an N channel MOS transistor of which back gate is short-circuited to the ground terminal. The power enforcement cell 5 (or ordinary power switch cell 4) includes a switch transistor and is insulated electrically from the high current consumption cell 3 at an N well in which their P channel MOS transistors are formed. Consequently, the voltage can be varied between the back gate of the switch P channel MOS transistor of the power enforcement cell 5 and the back gate of the P channel MOS transistor of the high current consumption cell 3.

When activating the power supply control region, the ordinary power switch cell 4 and the power enforcement cell 5 are combined to supply a supply voltage VDD to the subject supply voltage supply wiring 6-1 in response to the above described control signal PCNT. The VDD is supplied from the first upper layer wiring 8-1 or third upper layer wiring 8-3. At this time, the power enforcement cell 5 is supplied a low level signal as the control signal PCNT. When setting the power supply control region in the power off state, the power enforcement cell 5 is supplied a high level signal as the control signal PCNT.

Figure 2:
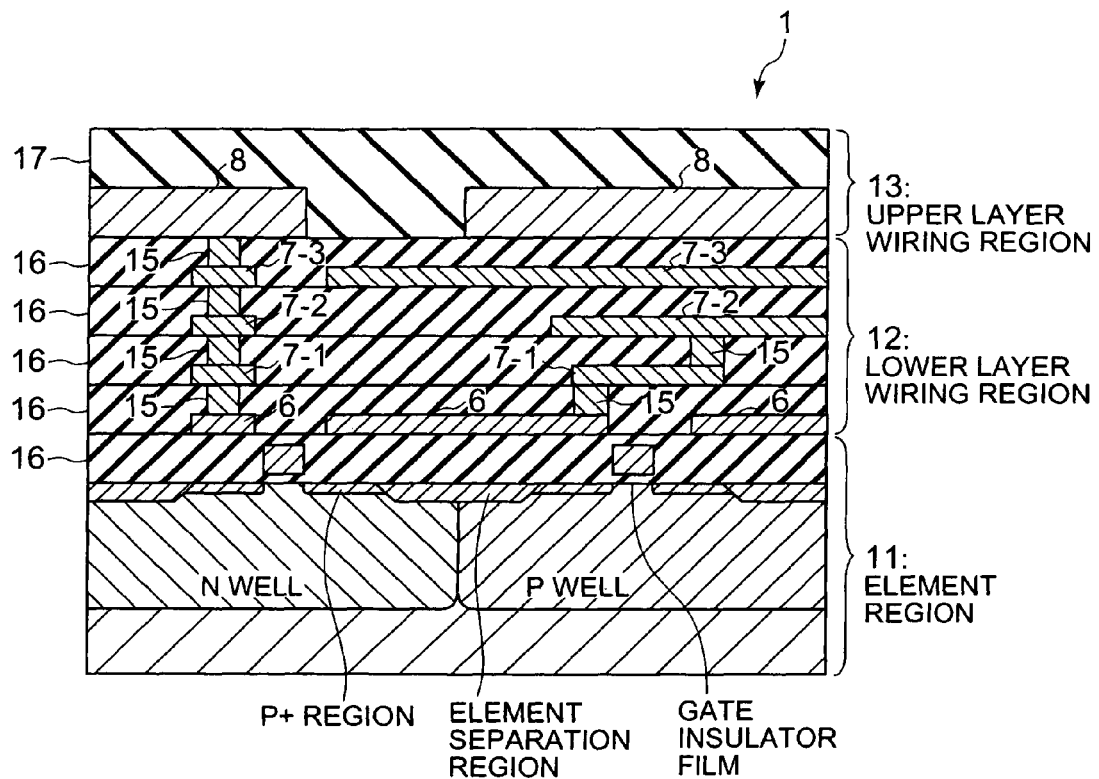
FIG. 2 is a cross sectional view of the semiconductor device 1 with respect to its configuration in the embodiment of the present invention.

FIG. 2 shows a cross sectional view of the semiconductor device 1 with respect to its configuration in this embodiment. The configuration of the semiconductor device 1 shown at a cross sectional view in FIG. 2 is a concept one. The semiconductor device 1 in this embodiment includes a multi-layer wiring layer on the substrate 14. In the element region 11 of the semiconductor device 1 are formed circuit elements (e.g., transistors). On the upper layer of the element region 11 is formed a lower layer wiring region 12. Furthermore, on the upper layer is formed an upper layer wiring region 13.

The lower wiring region 12 includes a first metal wiring 6 and a lower layer wiring 7. The first metal wiring 6 is formed on the lowermost layer of the lower layer wiring region 12 and the lower layer wiring 7 is formed on plural layers other than the lowermost layer. The upper layer wiring region 13 includes an upper layer wiring 8. In the embodiment described below, when any one of the plurality of lower layer wirings 7 is distinguished from others, a suffix number "-1" will be added to the end of the subject reference number "7" (e.g., "7-1"). Metal wirings formed on different wiring layers are connected to each another through vias 15. And an insulator film 16 is formed between metal wirings on different wiring layers respectively.

As shown in FIG. 2, the lower layer wiring region 12 is formed with a thin film. The upper layer wiring region 13 is formed with a thick film. The metal wirings (the first metal wiring 6 or lower layer wiring 7) laid in the lower layer wiring region 12 are formed with a thinner film respectively than the metal wirings (upper layer wiring 8) laid in the upper layer wiring region 13, so that the wiring can be made at narrower pitches. On the other hand, the upper layer wiring 8 formed with a thick film can be a low resistance wiring.

Figure 3:
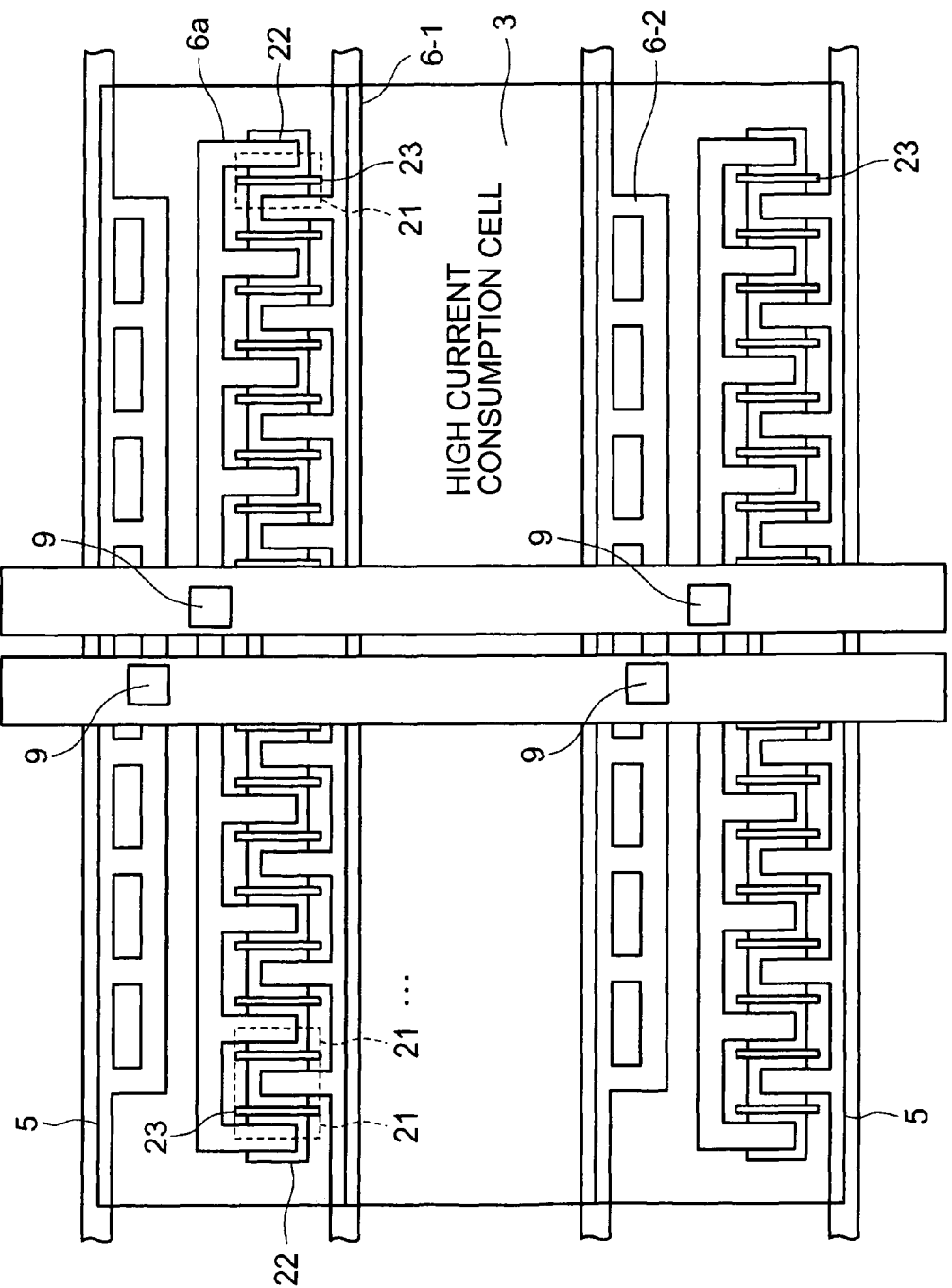
FIG. 3 is a top view of a high current consumption cell 3 and a power reinforcement cell including a power switch 5 with respect to their configurations in the embodiment of the present invention.

FIG. 3 shows a top view of a high current consumption cell 3 and a power enforcement cell including a power switch cell 5 with respect to their configurations in this embodiment. In FIG. 3, the high current consumption cell 3 and the power enforcement cell 5 are disposed adjacently to each other in order to simplify the description. In this layout shown in FIG. 3, the high current consumption cell 3 is disposed between a pair of power enforcement cells 5 respectively through the supply voltage supply wiring 6-1 and the ground voltage supply wiring 6-2. In this example, the upper half of the pair of power enforcement cells 5 is used to supply a supply voltage and the lower half thereof is used to connect the ground. The pair of power enforcement cells 5 may be inverted upside down so as to use the upper half to connect the ground and the lower half to supply the supply voltage, although it depends on the positions of the supply voltage supply wiring 6-1 and the ground voltage supply wiring 6-2.

If the wiring resistance of the supply voltage supply wiring 6-1 and the ground voltage supply wiring 6-2 is negligible, the high current consumption cell 3 may be disposed between the pair of power enforcement cells 5 so that the supply voltage is supplied to the supply voltage supply wiring 6-1 from the right and left sides of the high current consumption cell 3 and the high current consumption cell 3 is grounded from the pair of (right and left) power enforcement cells 5 through the ground voltage supply wiring 6-2. Furthermore, if the power supply capacity is enough, the power enforcement cell 5 may be disposed only at either the right or left side. In other words, according to the current consumption of the high current consumption cell 3 and the power supply capacity of the power enforcement cell 5, the configuration and disposition of the high current consumption cell 3 and the power enforcement cell 5 may be determined flexibly to be optimized.

In this embodiment, the current consumption per unit time (e.g., 1 sec) of the high current consumption cell 3 is over a predetermined value. For example, the high current consumption cell 3 may be any of a cell having a clock tree generated by the CTS (Clock Tree Synthesis) (hereinafter, to be referred to as the CTS buffer cell), a clock buffer cell, etc. In other words, the configuration of the high current consumption cell 3 is not limited only to the one in this embodiment; the high current consumption cell 3 may be a cell of which operation rate for a certain time is high just like the CTS buffer cell. The high current consumption cell 3 may also be a cell having a high toggle rate buffer, a cell having a high load buffer, etc.

The power enforcement cell including a power switch cell 5 includes plural first switch elements (P channel MOS transistors used as switches) 21. The first switch element (P channel MOS transistor used as a switch) 21 includes a diffusion layer 22 formed on a substrate and a gate electrode 23 formed on the substrate through a gate insulator film. The power enforcement cell 5 has a function to cut off the power supply to the first metal wiring 6 (supply voltage supply wiring 6-1 shown in FIG. 3) stacked on the high current consumption cell 3. The power enforcement cell 5 is connected to the upper wiring 8 through the first power supply via (stacked via) 9. The upper wiring 8 (third upper layer wiring 8-3 or fourth upper layer wiring 8-4) formed on the power enforcement cell 5 is supplied a current required to drive the high current consumption cell 3.

Figure 4:
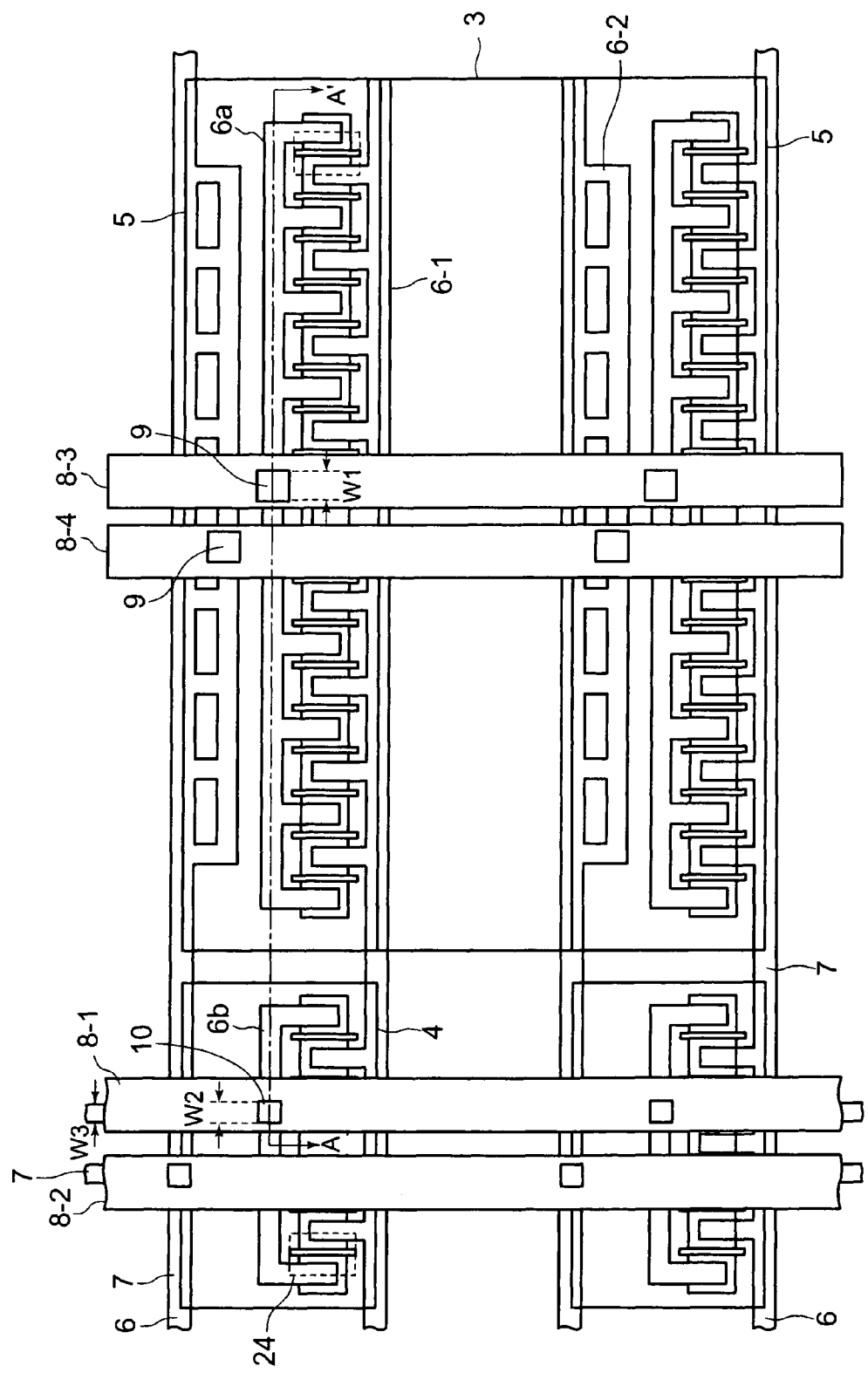
FIG. 4 is a top view of an ordinary power switch cell 4 and the power reinforcement cell including a power switch 5 with respect to their positional relationship in the semiconductor device 1 in the embodiment of the present invention.

FIG. 4 shows a top view of the semiconductor device 1 to illustrate a positional relationship between the ordinary power switch cell 4 and the power enforcement cell including a power switch cell 5. As shown in FIG. 4, the power enforcement cell 5 is disposed independently of the ordinary power switch cell 4. Furthermore, the first power supply via (stacked via) 9 that connects between the upper wiring 8 and the power enforcement cell 5 is the same in width as the first wiring having a width W1.

The electrode 6b of the ordinary power switch cell 4 is connected to the second power supply via 10. The second power supply via 10 is the same in width as the second wiring having a width W2. The lower wiring 7 formed between the first upper layer wiring 8-1 and the ordinary power switch cell 4 is the same in width as the third wiring having a width W3.

Figure 5:
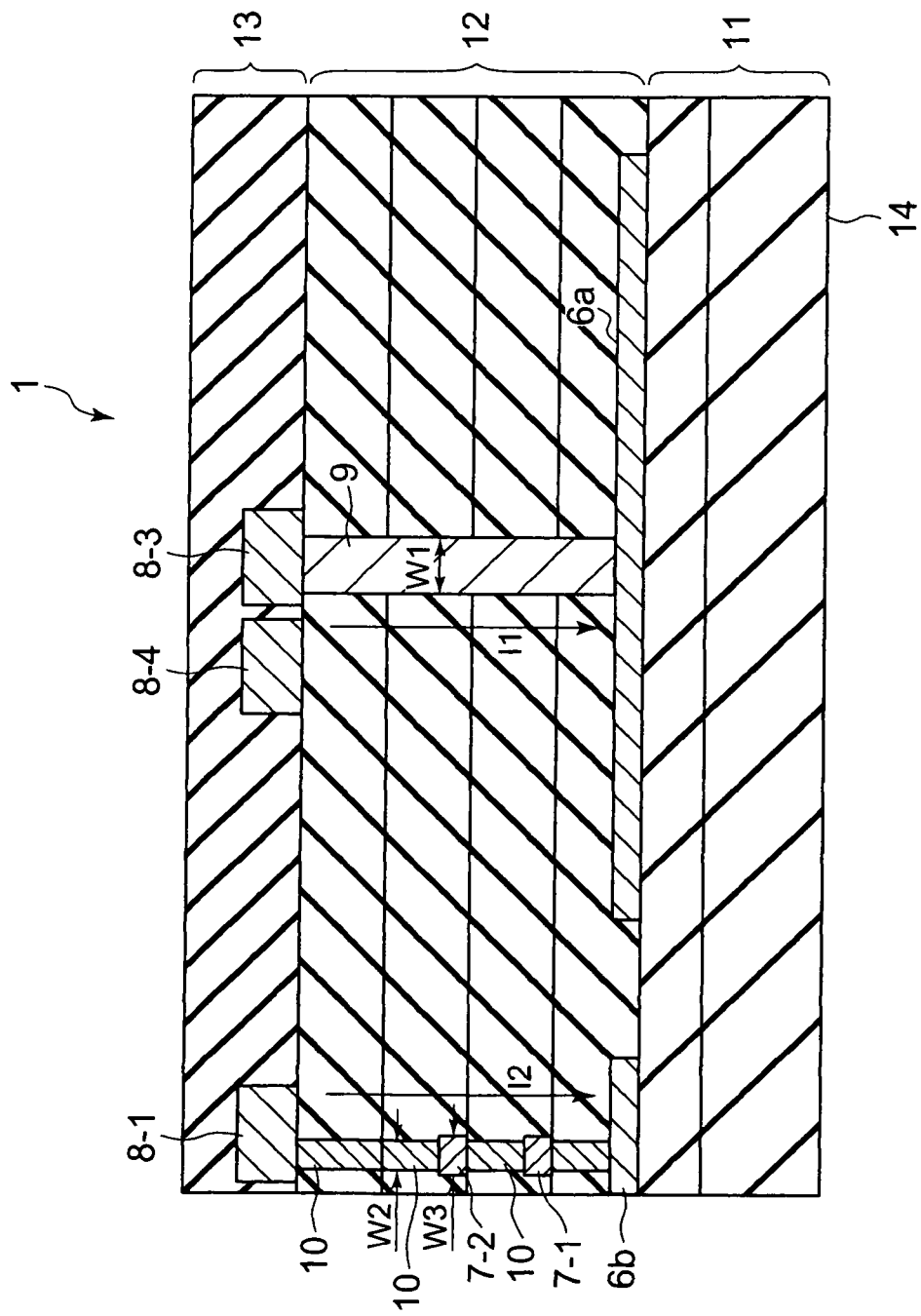
FIG. 5 is a cross sectional view of the semiconductor device 1 in the embodiment of the present invention.

FIG. 5 shows a cross sectional view of the semiconductor device 1, taken on line A-A' of FIG. 5, in this embodiment. As described above, in the semiconductor device 1 in this embodiment, the first power supply via (stacked via) 9 has the first wiring width W1. The first wiring width W1 is determined to protect the operation current of the high current consumption cell 3 from such defects as wiring breaks that might be caused by electro-migration. The second power supply via 10 has the second wiring width W2. The first lower layer wiring 7-1 and the second lower layer wiring 7-2 disposed in the lower layer wiring region 12 have the third wiring width W3 respectively.

Here, FIGS. 3A and 3B show the above described first switch element 21 is activated by a control signal supplied to the gate electrode 23. Furthermore, the second switch element 24 of the ordinary power switch cell 4 is also activated by the same control signal. A current required to drive the high current consumption cell 3 is supplied thereto through the supply voltage supply wiring 6-1. When the gate electrode 23 is activated, the first current I1 flows into the first power supply via (stacked via) 9. Similarly, when the second switch element 24 is activated, the second current I2 flows into the second power supply via 10. Consequently, if it is assumed that the third current I3 flows into the supply voltage supply wiring 6-1, the following condition will be satisfied:

Third current $I3$=first current $I1$+second current $I2$

In the semiconductor device 1 in this embodiment, a current that satisfies most of the current consumption in the high current consumption cell 3 is supplied through the first power supply via (stacked via) 9 as the first current I1. Consequently, the power supply wiring can be formed on the assumption that the second current I2 is at least required to drive the circuit cells (primitive cells 2) other than the high current consumption cell 3. Concretely, the third wiring width W3 of the lower wiring 7 can be determined "to protect the wiring 7 from such defects as wiring breaks by electro-migration that might be caused by the second current I2."

This makes it possible to form the wiring of the thin and narrow lower layer 7. Consequently, the area to be allocated to the lower layer wiring 7 can be suppressed with respect to all the wiring resources. This is why the semiconductor device 1 in this embodiment can suppress the increase of the chip area while securing the power supply wiring required for proper operations of the circuit cells.

COMPARATIVE EXAMPLE

Figure 6:
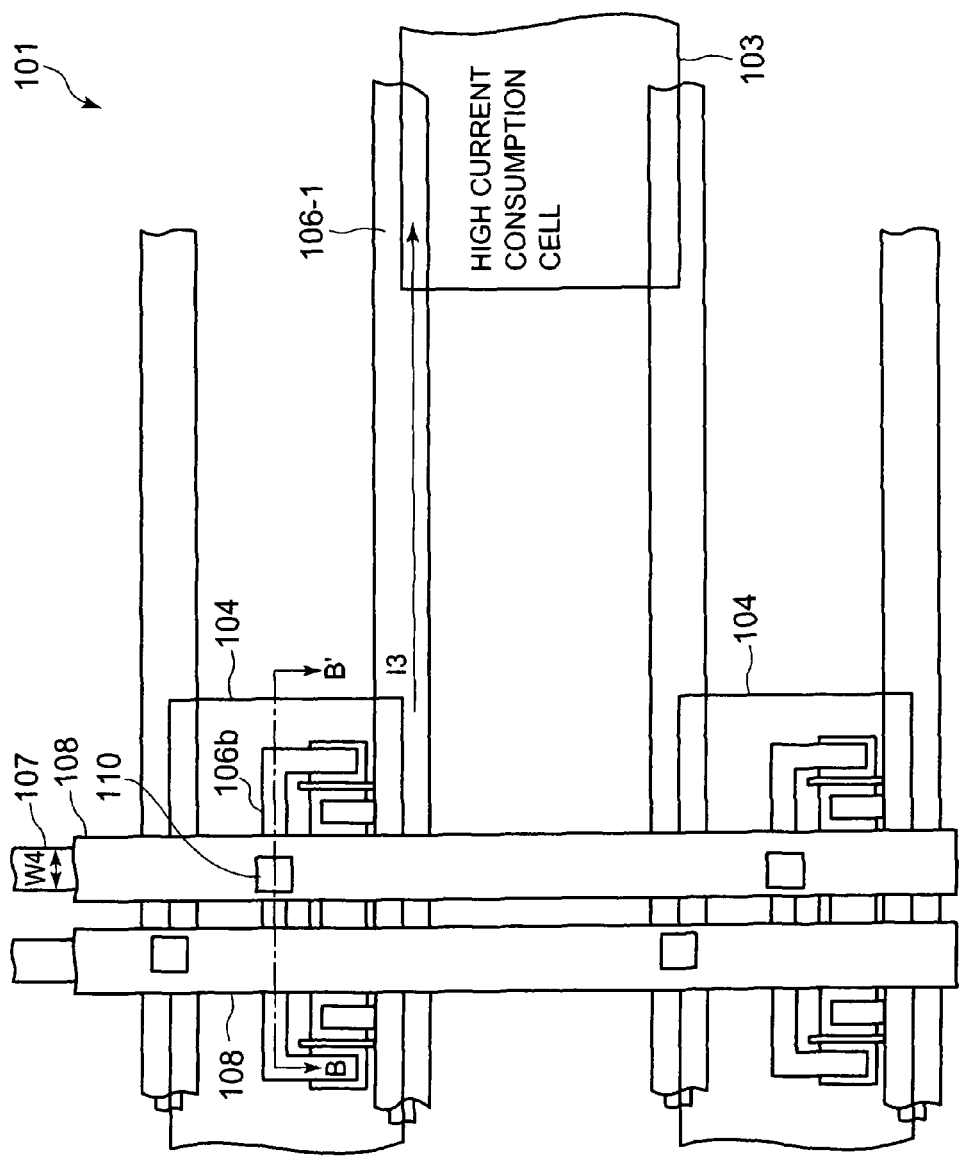
FIG. 6 is a top view of a semiconductor device 101 with respect to its configuration in a comparative example.

Next, there will be described an embodiment in which the semiconductor device 1 does not include the power enforcement cell including a power switch cell 5. FIG. 6 shows a top view of the semiconductor device 101 with respect to its configuration in this comparative example. The semiconductor device 101 includes a high current consumption cell 103 and an ordinary power switch cell 104. The high current consumption cell 103 is the same in configuration as the high current consumption cell 3 described above. The power supply terminal of the high current consumption cell 103 is connected to the supply voltage supply wiring 106-1. The ordinary power switch cell 104 is disposed between the supply voltage supply wiring 106-1 and the upper layer wiring 108. The electrode 106b of the ordinary power switch cell 104 is connected to the upper layer wiring 108 through the power supply via 110. And plural lower wirings 107 are disposed between the ordinary power switch cell 104 and the upper layer wiring 108.

Figure 7:
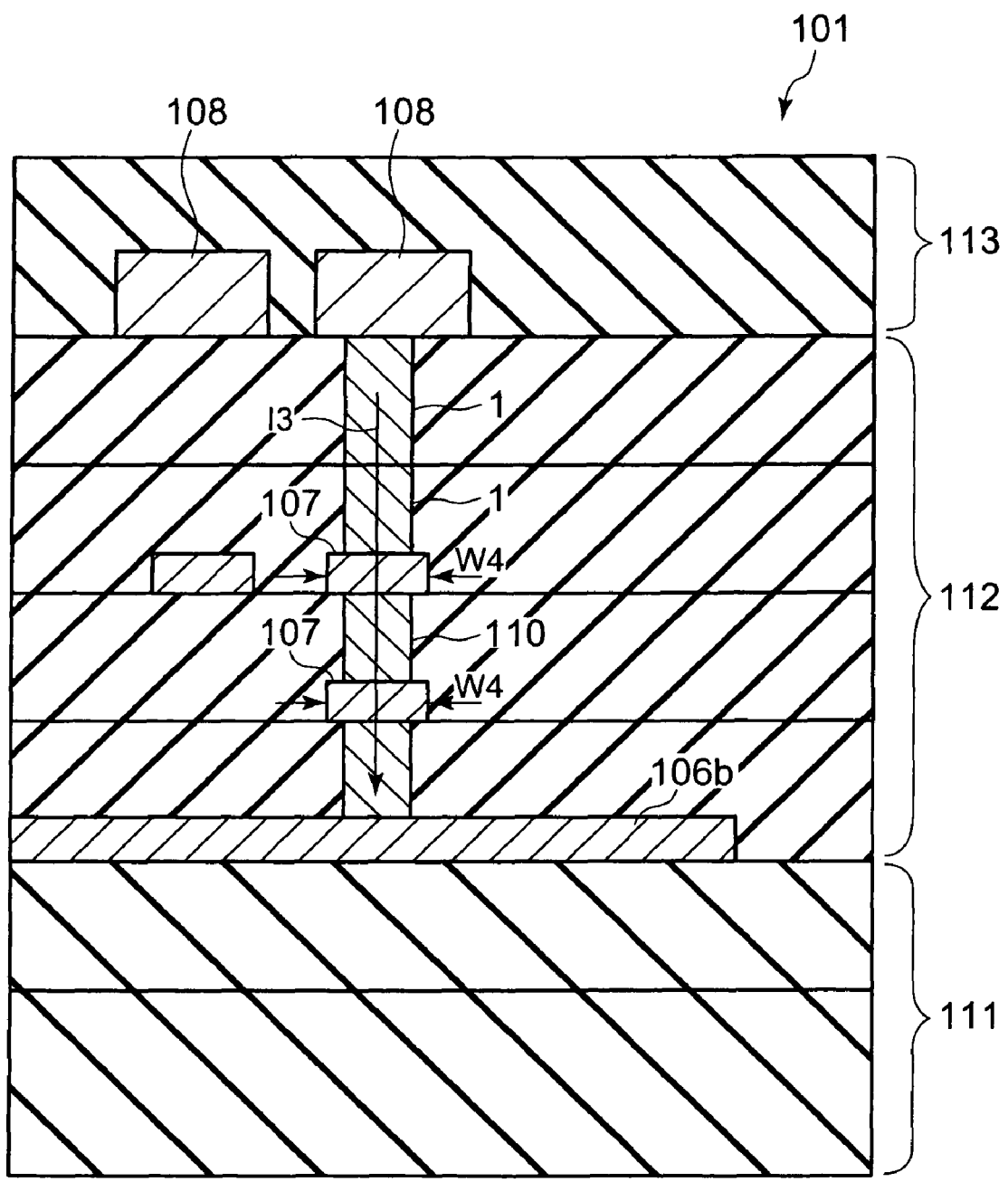
FIG. 7 is across sectional view of the semiconductor device 101 in the comparative example.

FIG. 7 shows a cross sectional view of the semiconductor device 101, taken on line B-B' of FIG. 6. As shown in FIG. 7, the semiconductor device 101 includes a multilayered wiring layer formed on the semiconductor substrate. The multilayered wiring layer includes a lower layer wiring region 112 and an upper layer wiring region 113. The lower layer wiring region 112 is formed with a thin film having a thin film wiring just like the lower layer wiring region 12 described above. The upper layer wiring region 113 is formed with a thin film having a thick film wiring just like the upper layer wiring region 13 described above.

The current (third current I3) required to drive the high current consumption cell 103 is supplied to "106" through the power supply via 110. The power supply via 110 is connected to the lower layer wiring 107 and the "106". Consequently, in the semiconductor device 101, the fourth wiring width W4 of the lower layer wiring 107 should be determined to "protect the layer 107 from such defects as wiring breaks that might be caused by electro-emigration of the third current I3". Concretely, the fourth wiring width W4 should be equal to the first wiring width W1 described above or over. Thus the semiconductor device 101 comes to be confronted with an increase of the area to be allocated to the lower layer wiring 107, as well as a problem that the wiring might disturb the reduction of the chip area to be achieved as a result of the progress of fine fabrication technology.

On the other hand, the semiconductor device 1 in this embodiment includes an independent route through which a required current (third current I3) is supplied to the high current consumption cell 3. This makes it possible to form a power supply route to the primitive cells 2 other than the high current consumption cell 3 through the lower layer wiring region 12 is established without increasing the width and film thickness of the lower layer wiring 7. As a result, this embodiment is enabled to suppress the increase of the rate of the power supply wiring to all the wiring resources and improve the freedom for disposing signal lines.

As described above, in the semiconductor device 1 in this embodiment, a power is supplied to the cells of which current consumption is comparatively low through the power lines (lower layer wiring 7 and upper layer wiring 8) disposed at equal intervals and through the second power supply vias 10 while a power is supplied to the cells of which current consumption is comparatively high through the power supply through-holes (first power supply vias 9) provided around those cells. In the semiconductor device 1 in this embodiment, the width (diameter) of the first power supply vias 9 and the width (diameter) of the second power supply vias 10 can be determined freely as needed. For example, in FIG. 4, the first upper layer wiring 8-1 or second upper layer wiring 8-2 is connected to the ordinary power switch cell 4 and the third upper layer wiring 8-3 or fourth upper layer wiring 8-4 is connected to the power enforcement cell 5 through one power supply via respectively. In this embodiment, instead of changing the diameter of the first power supply via 9 and the diameter of the second power supply via 10, the number of the first power supply vias 9 and the number of the second power supply vias 10 can be changed to adjust the amount of the subject current supply. For example, the third upper layer wiring 8-3 or fourth upper layer wiring 8-4 can be connected to the corresponding power enforcement cell 5 through plural first power supply vias 9. In the semiconductor device 1 in this embodiment, the first power supply via corresponding to the high current consumption cell 3 is required to supply a proper current to the high current consumption cell 3, although there are some exceptions. On the contrary, in case where plural cells of which current consumption is comparatively low (e.g., primitive cells 2) are disposed, the second power supply vias 10 corresponding to those primitive cells 2 are required to supply a current enough to compensate their operations.

For example, if the second power supply via 10 is required to have a power supply capacity enough to compensate the operation of the plurality of cells corresponding to the via 10, the via 10 often becomes wider than the first power supply via 9 having a current supply capacity enough to satisfy the current consumption in at least one high current consumption cell 3. Even in such a case, the semiconductor device 1 in this embodiment can form a route for supplying the lower layer wiring region 12 to each primitive cell 2 other than the high current consumption cell 3 without increasing the wiring width and film thickness of the lower layer wiring 7. Consequently, this embodiment can suppress the increase of the rate of the power supply wiring to all the wiring resources of the semiconductor device 1 without depending on the width (diameter) of the through-holes, thereby improving the freedom for disposing signal lines.

Figure 8:
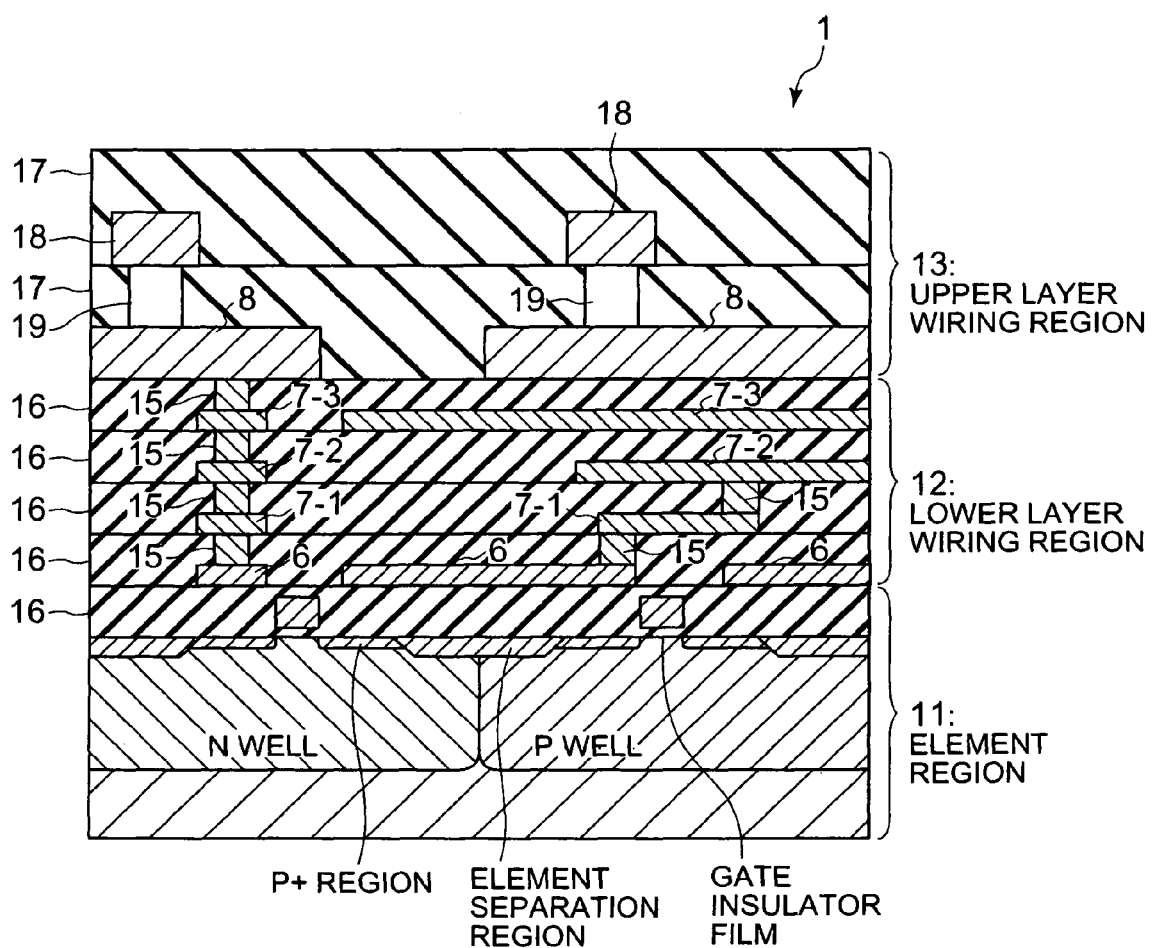
FIG. 8 is a cross sectional view of one example of the upper wirings of the semiconductor 1 in the embodiment of the invention.

As described above, the first upper layer wiring 8-1 is connected to the third upper layer wiring in the semiconductor chip. Similarly, the second layer upper wiring 8-2 is connected to the forth upper layer wiring in the semiconductor chip. Hereinafter, some examples are disclosed. FIG. 8 discloses a cross sectional view of one example of upper layer structure of the embodiment. The upper layer wiring region 13 may have a plurality of wiring layers. FIG. 8 discloses second layer upper layer wirings 18 other than first layer upper layer wirings 8. Each of the second layer upper layer wirings 18 may be contact with at least one of first layer upper layer wirings 8 through at least one plug 19. A plurality of layers of upper layer wirings make it easy to wire low impedance wirings lengthwise and crosswise.

Figure 9:
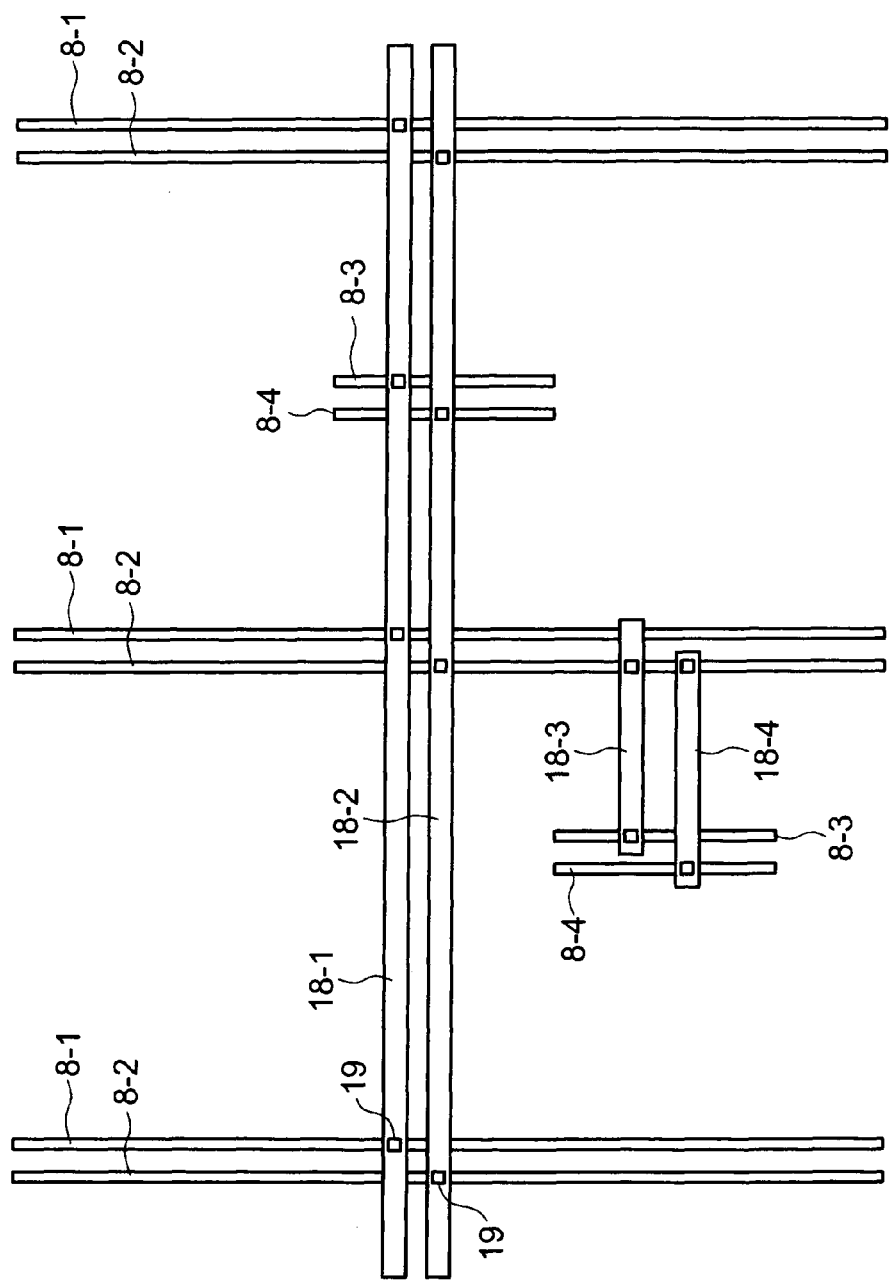
FIG. 9 is a top view of one example of the upper wirings of the semiconductor 1.

Next, FIG. 9 discloses a top view of upper wirings structure using a plurality of layers of upper layer wirings above mentioned. In FIG. 9, lower layer structures are abbreviated to avoid complicated, but the lower layer structures are the same as the structures in FIG. 1A. The first layer upper layer wirings 8-1 and 8-3 are connected each other though the corresponding plugs 19 and the corresponding second layer upper layer wirings 18-1 or 18-3. Similarly, the first layer upper layer wirings 8-2 and 8-4 are connected each other though the corresponding plugs 19 and the corresponding second layer upper layer wirings 18-2 or 18-4. It is not shown in the figures that the power reinforcement cell including a power switch cell 5 may be directly connected to the basic power supply wirings 8-1 and 8-2 through lower layer wirings 7-1, 7-2, and 7-3 without through upper layer wirings.

Figure 10:
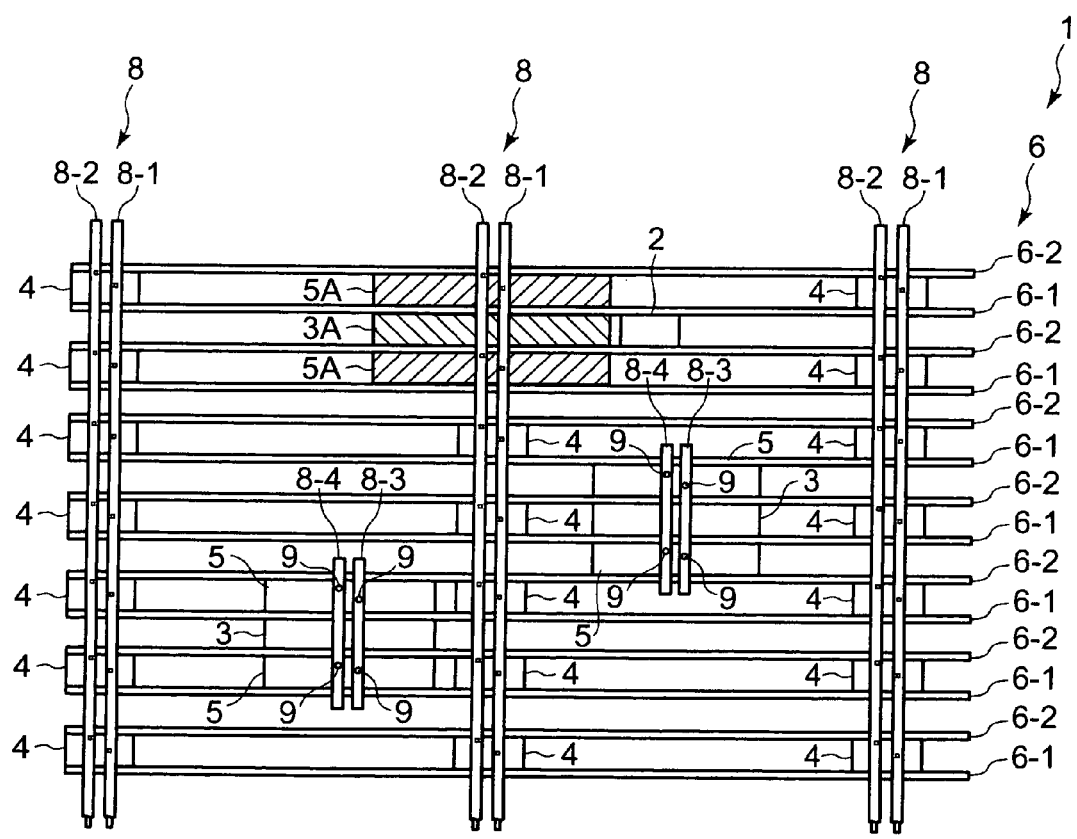
FIG. 10 is a top view of another example of the semiconductor device 1 in the embodiment.

FIG. 10 discloses a high current consumption cell 3A and a power reinforcement cell including a power switch cell 5A are laid directly under the basic power supply wirings 8-1 and 8-2. The power reinforcement cell including a power switch cell 5A may be directly connected to the basic power supply wirings 8-1 and 8-2 through the vias 9.

In the embodiment described above, a power switch (P channel MOS transistor used as a switch) is provided at the high supply voltage side, but the power switch may be provided at the grounding side (low supply voltage side) or at both sides of the high and low supply voltages respectively.

It is apparent that the present invention is not limited to the above embodiments, but maybe modified and changed without departing from the scope and spirit of the invention.

What is claimed is:

1. A semiconductor device, comprising:
   a plurality of basic power supply wirings laid in a first direction;
   a plurality of local power supply wirings laid in a direction crossing the first direction;
   a plurality of ordinary power switch cells disposed corresponding to each crossings of the plurality of basic power supply wirings and the plurality of local power supply wirings, and each of the plurality of ordinary power switch cells coupled between corresponding one of the plurality of basic power supply wirings and corresponding one of the plurality of local power supply wirings;
   a plurality of circuit cells coupled to one of the plurality of local power supply wirings; and
   a power reinforcement cell disposed correspond to specific one of the plurality of circuit cells, the power reinforcement cell including a power switch, the power switch coupled to corresponding one of the local power supply wirings, said one of the local power wiring coupled to said specific one of the plurality of circuit cells,
   wherein the specific circuit cell comprises a clock buffer cell.

2. The semiconductor device according to claim 1,
   wherein the power reinforcement cell is disposed adjacent to the specific circuit cell with a corresponding power supply wiring therebetween and the power reinforcement cell is configured to supply a power to the specific circuit cell through the corresponding local power supply wiring.

3. The semiconductor device according to claim 1,
   wherein one end of the power switch of the power reinforcement cell is coupled to a basic power supply wiring and the other end thereof is coupled to the corresponding one of the local power supply wirings near the specific circuit cell.

4. The semiconductor device according to claim 3,
   wherein the plurality of basic power supply wirings include a plurality of first power supply wirings receiving a supply of a first voltage and a plurality of power supply wirings receiving a supply of a second voltage;

wherein the plurality of local power supply wirings include a first local power supply wiring coupled to the first power supply wiring and a second local power supply wiring coupled to the second power supply wiring through a corresponding ordinary power switch respectively;

wherein the plurality of circuit cells are disposed between corresponding first and second local power supply wirings respectively and coupled to the corresponding first and second local power supply wirings respectively; and wherein the power reinforcement cell includes:
a first power reinforcement cell block disposed adjacent to a specific circuit cell with a first local power supply wiring corresponding to the specific circuit cell therebetween so as to supply a first voltage to the specific circuit cell through the corresponding first local power supply wiring; and a second power reinforcement cell block disposed adjacent to a specific circuit cell with a second local power supply wiring corresponding to the specific circuit cell therebetween so as to supply a second voltage to the specific circuit cell through the corresponding second local power supply wiring.

5. The semiconductor device according to claim 1,
wherein the basic power supply wirings are coupled to the ordinary power switch cells via through-holes respectively;

wherein the basic power supply wirings are connected to the power reinforcement cell via the through-holes and a power supply wiring provided in upper wiring layers; and wherein the diameter of first through-holes differs from the diameter of second through-holes, or the number of the first through-holes differs from the number of the second through-holes, the first through-holes connecting the power supply wiring to the reinforcement cell, the second though-holes connecting the basic power supply wirings to the ordinary power switch cells respectively.

6. The semiconductor device according to claim 4,
wherein at least one of the first local power supply wiring and the second local power supply wiring is supplied a power from a corresponding power supply when the power switches included in each of the ordinary power switch cell and the power reinforcement cell are turned on, and is cut off the power when the power switches are turned off.

* * * * *